United States Patent
Ogawa et al.

(10) Patent No.: US 7,542,527 B2
(45) Date of Patent: Jun. 2, 2009

(54) FREQUENCY OFFSET CORRECTION CIRCUIT DEVICE

(75) Inventors: Jun Ogawa, Souraku-gun (JP); Mototugu Shiraiwa, Yokohama (JP)

(73) Assignee: Panasonic Corporation, Osaka (JP)

( * ) Notice: Subject to any disclaimer, the term of this patent is extended or adjusted under 35 U.S.C. 154(b) by 598 days.

(21) Appl. No.: 11/219,774

(22) Filed: Sep. 7, 2005

(65) Prior Publication Data

US 2006/0067435 A1    Mar. 30, 2006

(30) Foreign Application Priority Data

Sep. 27, 2004    (JP) .............................. 2004-278594

(51) Int. Cl.
*H04L 27/06* (2006.01)
*H04L 27/00* (2006.01)
*H03K 9/00* (2006.01)

(52) U.S. Cl. .................... 375/340; 375/316; 375/317

(58) Field of Classification Search ................ 375/340, 375/316, 317
See application file for complete search history.

(56) References Cited

U.S. PATENT DOCUMENTS

| | | | | |
|---|---|---|---|---|
| 5,438,692 A | * | 8/1995 | Mohindra | .................... 455/324 |
| 5,970,397 A | * | 10/1999 | Klank et al. | ................. 455/139 |
| 6,633,752 B1 | | 10/2003 | Hashigaya | .................. 455/296 |
| 6,731,698 B1 | | 5/2004 | Yoshie | ........................ 375/327 |
| 2004/0190650 A1 | | 9/2004 | Korram et al. | .............. 375/334 |
| 2004/0264582 A1 | * | 12/2004 | Mauritz et al. | .............. 375/257 |

\* cited by examiner

*Primary Examiner*—David C Payne
*Assistant Examiner*—Brian J Stevens
(74) *Attorney, Agent, or Firm*—Steptoe & Johnson LLP

(57) ABSTRACT

A semiconductor circuit device is provided which can attain more stable operations against noise in a data communication system without increasing the power consumption of an overall system, thereby improving the reliability of data communication. For a demodulation baseband signal (S11) obtained by performing digital processing on an output signal (S6) from an AD converter (6), the maximum value (S12) and the minimum value (S13) are detected as digital values by a maximum value holding circuit (11) and a minimum value holding circuit (12), an averaging circuit (13) obtains an average value (intermediate value) of the maximum value and the minimum value and detects a frequency offset amount (S14), and the frequency offset amount is fed back to a threshold value of data decision (14), so that binarized demodulation data (S15) is outputted in which the offset of the demodulation baseband signal is corrected.

11 Claims, 6 Drawing Sheets

FREQUENCY OFFSET CORRECTION CIRCUIT DEVICE

FIELD OF THE INVENTION

The present invention relates to a semiconductor circuit device for detecting and correcting a frequency offset generated between a transmit side and a receive side in data communication through FSK radio communication using an FSK signal, which is one of frequency modulation signals.

BACKGROUND OF THE INVENTION

Conventionally, data communication for wirelessly transmitting various data through FSK radio communication using an FSK (frequency shift keying) signal is widely used as a system of data communication. The FSK signal is one of FM (frequency modulation) signals.

In the data communication through FSK radio communication, when data is transmitted, a high-frequency signal is transmitted as a radio wave, the high-frequency signal having been frequency-modulated by frequency-shifting a carrier so as to correspond to 1 and 0 of a digital signal of the data. When the high-frequency signal is received by an FSK receiver and the transmitted data is demodulated, the frequency components of a demodulation baseband signal having been voltage-converted by an F-V converter circuit are compared with each other by a comparator to determine a digital value, and the original data is obtained based on the digital value.

In the frequency modulation system, between a transmit side and a receive side, a frequency offset occurs due to a frequency generation error on a quartz radiator, a local oscillator (hereinafter, referred to as PLL), and the like of the transmit side and receive side. The frequency offset becomes a DC offset component when frequency-voltage conversion is performed to obtain a demodulation baseband signal.

In conventional FSK receivers, FSK demodulation is performed in an analog manner, and thus a frequency offset is equivalent to a fluctuation in the reference voltage of a comparator for data decision. Further, due to a frequency offset, the frequency of a carrier is shifted close to the cutoff frequency of a filter when the carrier passes through the filer. Thus, particularly in the case of communications in a narrow transmission band, the attenuation of the filter exercises considerable influence. These factors have seriously adverse effects on the receiving characteristic of the FSK receivers.

As described above, in the conventional FSK receivers (for example, Japanese Patent Laid-Open No. 2000-349840), FSK demodulation is performed in an analog manner. In this case, a demodulation baseband signal having undergone frequency-voltage conversion is extracted by C coupling and a DC offset component on the demodulation baseband signal is removed, so that a demodulation error caused by a DC offset is corrected and the adverse effects on the receiving characteristic are avoided.

Further, a difference is obtained between the signal where the DC offset component on the demodulation baseband signal is removed by C coupling and a demodulation baseband signal with a DC offset before C coupling, so that the DC offset component is detected on the demodulation baseband signal having undergone frequency-voltage conversion. The reference voltage in a comparator for data decision is corrected according to an offset amount and a frequency offset is equally corrected.

However, in the conventional method of correcting a frequency offset, all circuits including detectors and correcting units conventionally have analog configurations in the FSK receivers. In this case, there are many variations in operating characteristics among the circuits, the accuracy of detecting a DC offset component from a demodulation baseband signal is reduced by noise, and thus a DC offset cannot be accurately detected or corrected. Consequently, operations become susceptible to noise and become less stable in a data communication system through FSK radio communication.

Once a malfunction occurs due to noise, the circuits may enter an oscillation state. Thus, the power consumption of an overall system increases, the data communication system becomes less stable, and the reliability of data communications seriously decreases.

DISCLOSURE OF THE INVENTION

The present invention is devised to solve the conventional problems and provides a semiconductor circuit device which can obtain more stable operations against noise in a data communication system without increasing the power consumption of the overall system, thereby improving the reliability of data communication.

In order to solve the problems, the semiconductor circuit device of the present invention is a semiconductor circuit device for demodulating digital data from a high-frequency signal having a carrier frequency-modulated based on the digital data, comprising a digital IQ demodulator for performing quadrature demodulation on a digital signal obtained by digital conversion from an analog signal having been obtained by frequency-converting the high-frequency signal while using the oscillation output of a PLL as a reference frequency signal, an F-V converter circuit for converting a frequency of a digital output signal from the digital IQ demodulator to a voltage and outputting a demodulation baseband signal corresponding to the digital data after passing the digital output signal through band-pass filters, a maximum value holding circuit for holding the maximum value of the demodulation baseband signal outputted from the F-V converter circuit, a minimum value holding circuit for holding the minimum value of the demodulation baseband signal, an averaging circuit for averaging the maximum value of the demodulation baseband signal and the minimum value of the baseband signal, a frequency offset detector for detecting a frequency offset amount on the demodulation baseband signal from the averaging circuit, and an offset correcting unit for correcting the frequency offset amount on the demodulation baseband signal by using the frequency offset amount as a feedback signal to a threshold value for deciding the data of the demodulation baseband signal, the frequency offset amount having been detected by the frequency offset detector.

With this configuration, a frequency offset is accurately detected with a small circuit size and fed back to a threshold value for data decision, thereby accurately performing data decision of the demodulation baseband signal and improving a receiving characteristic.

The semiconductor circuit device of the present invention further comprises a frequency converter circuit for frequency-converting the frequency offset amount having been detected by the frequency offset detector, and a filter bandwidth correcting unit for correcting the bandwidth of the band-pass filter based on a frequency converted value corresponding to the frequency offset amount having been calculated by the frequency converter circuit.

The semiconductor circuit device of the present invention further comprises a demodulator offset correcting unit for correcting the frequency offset amount on the demodulation baseband signal for the digital IQ demodulator based on the frequency converted value corresponding to the frequency offset amount having been calculated by the frequency converter circuit.

The semiconductor circuit device of the present invention further comprises a PLL frequency correcting unit for controlling the frequency of the oscillation output of the PLL and correcting the frequency offset amount on the demodulation baseband signal based on the frequency converted value corresponding to the frequency offset amount having been calculated by the frequency converter circuit.

With this configuration, it is possible to make a correction in the same direction as the center frequency of the filter relative to the cutoff frequency of the filter, thereby improving the receiving characteristic.

The semiconductor circuit device of the present invention further comprises a feedback gain circuit which provides a given gain for the frequency offset amount having been detected by the frequency offset detector, and uses the frequency offset amount as the feedback signal to the threshold value for deciding the data of the demodulation baseband signal.

With this configuration, a correction amount is adjusted by the feedback gain circuit, thereby improving the stability of a system.

The semiconductor circuit device of the present invention further comprises an operation controller circuit for periodically operating the frequency offset detector, and a timer counter for counting a duty cycle of the frequency offset detector operated by the operation controller circuit.

The semiconductor circuit device of the present invention further comprises a counting period storage device for storing a set value for setting the counting period of the timer counter at a given value.

The semiconductor circuit device of the present invention further comprises a frequency offset value storage device for storing the frequency offset value having been detected by the frequency offset detector, and an operation controller circuit for exercising control to update the value of the frequency offset value storage device with a given period.

With this operation, the system is intermittently operated arbitrarily or automatically, thereby reducing the power consumption of the system.

The semiconductor circuit device of the present invention further comprises a comparator for comparing the frequency offset value having been stored in the frequency offset value storage device and the frequency offset value currently detected by the frequency offset detector, and a unit for deciding a change in the frequency offset value based on a comparison result of the comparator, causing the counting period storage device to store a count set value of the timer counter according to a decision result, and changing the duty cycle of the frequency offset detector operated by the operation controller circuit.

The semiconductor circuit device of the present invention further comprises an operation controller circuit for generating a control signal for controlling the update of the frequency offset value, the control signal being generated according to a moving direction and a movement amount decided based on the code of the frequency offset value in the comparison result of the comparator.

With this configuration, a limit is imposed according to a change in the frequency offset value, thereby improving the stability of the system.

The semiconductor circuit device of the present invention further comprises an F detector circuit for deciding the period of the timer counter, and a bit mask circuit for masking the specific bits of the demodulation baseband signal according to the period decided by the F detector circuit.

With this configuration, the system is intermittently operated arbitrarily or automatically, thereby reducing the power consumption of the system.

As described above, according to the present invention, a frequency offset is accurately detected with a small circuit size and fed back to a threshold value for data decision, thereby accurately performing data decision of the demodulation baseband signal and improving a receiving characteristic.

Further, it is possible to make a correction in the same direction as the center frequency of the filter relative to the cutoff frequency of the filter, thereby improving the receiving characteristic.

Moreover, a correction amount is adjusted by the feedback gain circuit, thereby improving the stability of the system.

Besides, the system is intermittently operated arbitrarily or automatically, thereby reducing the power consumption of the system.

Additionally, a limit is imposed according to a change in the frequency offset value, thereby improving the stability of the system.

As described above, it is possible to prevent the accuracy of detecting a DC offset component on the demodulation baseband signal from being reduced by the presence of noise, prevent an unstable operating state caused by a malfunction resulting from the lower accuracy of detection, and accurately detect and correct a frequency offset component on the demodulation baseband signal.

As a result, a data communication system can attain more stable operations against noise without increasing the power consumption of the overall system, thereby improving the reliability of data communication.

According to the semiconductor circuit device of the present invention, the data communication system can attain more stable operations against noise without increasing the power consumption of the overall system, thereby improving the reliability of data communication. In the field of data communication, the semiconductor circuit device is useful in a communication system using frequency modulation, for example, FSK demodulation. The semiconductor circuit device is particularly useful in the field of radios requiring low cost and low power consumption in a narrow band, and thus industrially applicable.

DESCRIPTION OF THE EMBODIMENTS

A semiconductor circuit device showing embodiments of the present invention will be specifically discussed below with reference to the accompanying drawings.

Embodiment 1

A semiconductor circuit device will be discussed below according to Embodiment 1 of the present invention.

Figure 1:
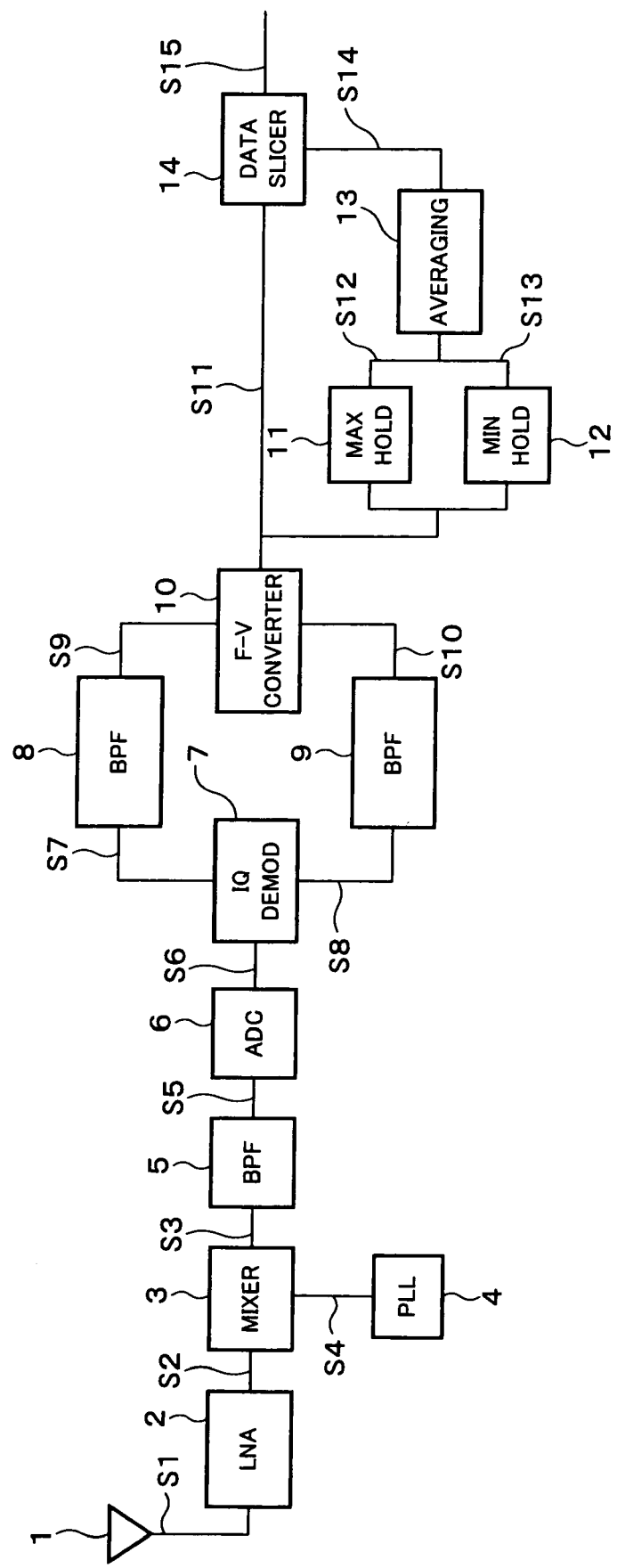
FIG. 1 is a block diagram showing a schematic configuration of an FSK radio using a semiconductor circuit device according to Embodiment 1 of the present invention.

FIG. 1 is a block diagram showing a structural example of the semiconductor circuit device according to Embodiment 1 and showing a circuit configuration for correcting a frequency offset of a receiver according to the FSK method in response to a data decision result.

Figure 2:
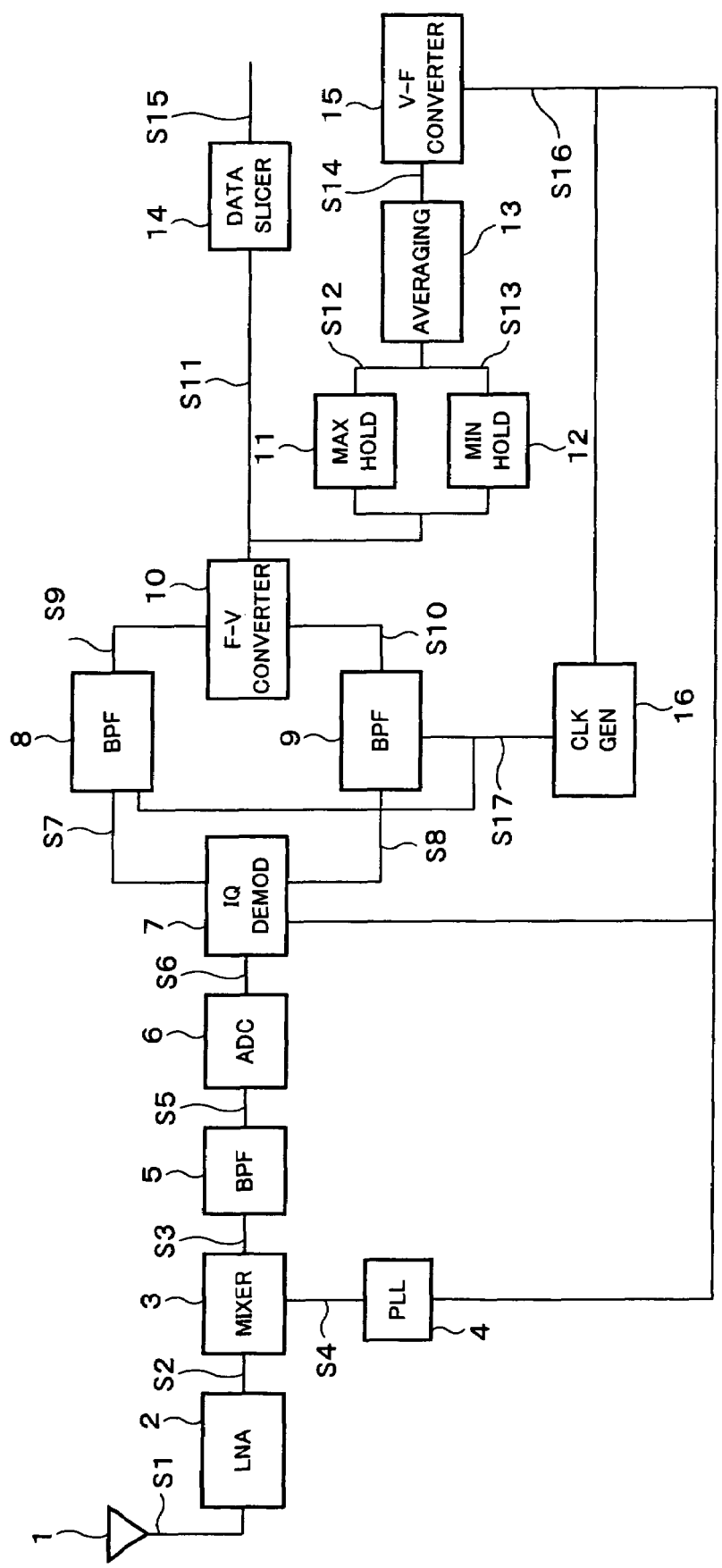
FIG. 2 is a block diagram showing another schematic configuration of the FSK radio using the semiconductor circuit device according to Embodiment 1.
Figure 3:
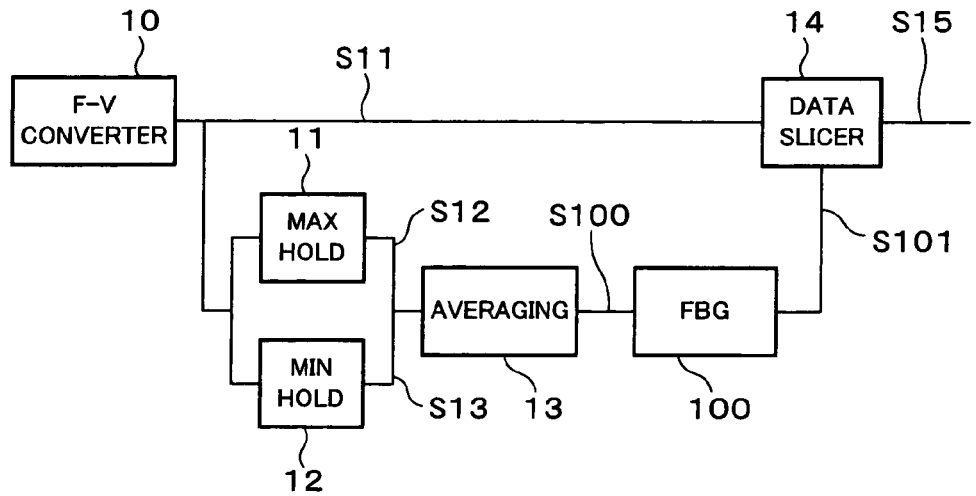
FIG. 3 is a block diagram showing the configuration of a feedback gain circuit in the semiconductor circuit device according to Embodiment 1.

FIG. 2 is a block diagram showing another structural example of the semiconductor circuit device according to Embodiment 1 and showing a circuit configuration for correcting a frequency offset of the receiver according to the FSK method in response to an input carrier. FIG. 3 is a block diagram showing still another structural example of the semiconductor circuit device according to Embodiment 1 and showing a circuit configuration for stabilizing the correction of a frequency offset of the receiver according to the FSK method.

As shown in FIG. 1, the semiconductor circuit device has an antenna 1 for receiving an FSK signal as a high-frequency signal, antenna receive data S1 which is the FSK signal received by the antenna 1, a low noise amplifier (LNA) 2 for amplifying the antenna receive data S1 to a receivable level, amplification receive data S2 outputted by the low noise amplifier 2, a mixer (MIXER) 3 for frequency-converting the amplification receive data S2 to an intermediate frequency, PLL 4 for generating a reference frequency for the MIXER 3, a reference frequency signal S4 generated from the PLL 4, a frequency-converted FSK signal S3 with the intermediate frequency obtained by frequency-converting the amplification receive data S2 based on the reference frequency signal S4 in the MIXER 3, an analog band-pass filter (BPF) 5 having an intermediate frequency band as a passband, a filter passed FSK signal S5 obtained by removing noise through the analog BPF 5, an AD converter 6 for converting the filter passed FSK signal S5 from an analog signal to a digital signal, an AD converted FSK signal S6 obtained by digital conversion through the AD converter 6, a digital IQ demodulator 7 for performing quadrature demodulation on the AD converted FSK signal S6 in a digital manner, an I (in-phase) signal S7 and a Q (quadrature) signal S8 which are generated by the digital IQ demodulator 7, band-pass filters 8 and 9 for band-limiting the I signal S7 and the Q signal S8 with a channel width, a filter passed I signal S9 and a filter passed Q signal S10 which have been band-limited by the band-pass filter 8, an F-V converter circuit 10 for performing baseband demodulation using the filter passed I signal S9 and filter passed Q signal S10 which have been obtained by channel selection, a demodulation baseband signal S11 having undergone frequency-voltage conversion, a maximum value holding circuit 11 for holing the maximum value of the demodulation baseband signal S11, a minimum value holding circuit 12 for holding the minimum value of the demodulation baseband signal S11, an averaging circuit 13 for calculating an average value based on a maximum held value S12 of the maximum value holding circuit 11 and a minimum held value S13 of the minimum value holding circuit 12, a frequency offset value (amount) S14 which is the output of the averaging circuit 13, a data slicer 14 for deciding the data of the demodulation base band signal S11 by using the frequency offset value S14, and binarized demodulation data S15 having been binarized by the data slicer 14.

As shown in FIG. 2, in addition to the configuration of FIG. 1, the semiconductor circuit device has a V-F converter circuit 15 for converting the frequency offset value S14 to a frequency, a clock generating section 16 serving as a filter bandwidth correcting unit for switching the frequency of an operating clock, which is supplied to the band-pass filters 8 and 9, according to a frequency offset frequency converted value S16 serving as the output of the V-F converter circuit and for correcting the bandwidths of the band-pass filters 8 and 9, and a filter operating clock signal S17 outputted from the clock generating section 16.

Furthermore, as shown in FIG. 3, the semiconductor circuit device has a frequency offset amount S100 which is the output of the averaging circuit 13, a feedback gain circuit 100 for providing the frequency offset amount S100 with a given gain, and a feedback gain value S101 which is the output value obtained after the feedback gain.

First, the following will discuss the specific operations of the semiconductor circuit device shown in FIG. 1.

The FSK signal as a high-frequency signal is modulated to a carrier frequency band and received by the antenna 1. The antenna receive data S1, which is the received FSK signal, is amplified by the low noise amplifier 2 to a level sufficiently enabling a demodulating operation and is outputted as the amplification receive data S2. A signal of a high-frequency band of MHz used in the FSK method causes a large loss in digital processing, and thus the signal is frequency-converted to an intermediate frequency of KHz by the MIXER 3. In this case, the PLL 4 generates the reference frequency signal S4 as a local oscillation signal for the MIXER 3 when the signal is frequency-converted to the intermediate frequency. By supplying the reference frequency signal S4 to the MIXER 3, it is possible to perform frequency conversion to the intermediate frequency according to the reference frequency S4.

The frequency-converted FSK signal S3 having been frequency-converted thus is converted to the filter passed FSK signal S5 by the analog BPF 5 to remove a noise component and a disturbing component which are included in the carrier after the frequency conversion. At this point, to perform digital processing, the filter passed FSK signal S5 is digitally converted by the AD converter 6 to the AD converted FSK signal S6. Various demodulation methods are available for the FSK signal. In the following explanation, a method of performing quadrature demodulation and frequency voltage conversion by means of an IQ signal is selected as an example.

First, for quadrature demodulation, the AD converted FSK signal S6 serving as a digital signal is demodulated to the I signal S7 serving as an in-phase component and the Q signal S8 serving as a quadrature component by the digital IQ demodulator 7. A disturbing wave of an adjacent channel or larger is removed from the signals by the band-pass filters 8 and 9 having a bandwidth of a channel width, and the signals are transmitted as the filter passed I signal S9 and the filter passed Q signal S10 to the F-V converter circuit 10. The demodulation baseband signal S11 having been converted to a voltage by the F-V converter circuit 10 is a digital signal having a given bit range, and the demodulation baseband signal S11 is outputted from the data slicer 14, which binarizes the signal with threshold decision, as the binarized demodulation data S15 serving as a digital demodulation signal.

Then, the maximum value of the demodulation baseband signal S11 serving as a digital signal is held at a given time by the maximum value holding circuit 11. Similarly, the minimum value of the demodulation baseband signal S11 is held by the minimum value holding circuit 12. The maximum held value S12 and the minimum held value S13, which are the outputs of the maximum value holding circuit 11 and the minimum value holding circuit 12, are averaged to obtain an intermediate value. This value is a displacement from 0 point and thus is outputted as the frequency offset amount S14 from a frequency offset detector composed of these constituent elements. The value of the frequency offset amount S14 is transmitted to the data slicer 14. An offset correcting unit makes it possible to perform data decision in consideration of the frequency offset amount with the frequency offset amount S14 serving as a threshold value of the data decision. Since a digital value is used, the data decision can be accurately performed.

Similarly, in FIG. 2, when the V-F converter circuit 15 for frequency-converting the digital value of the frequency offset amount S14 makes a conversion in, e.g., kHz, the V-F converter circuit 15 uses a frequency conversion method of using the mask of a bit of the frequency offset amount S14 or a table reference with the resolving power of the frequency offset amount S14, and the V-F converter circuit 15 outputs a corresponding frequency value instead of the digital value of the frequency offset amount S14. The output of the V-F converter circuit 15 is the frequency offset frequency converted value S16. When the frequency offset frequency converted value S16 is sent to the clock generating section 16 for supplying a clock to the band-pass filters 8 and 9, the frequency division ratio of a clock frequency is switched according to the value, so that clock frequencies to be supplied to the band-pass filters 8 and 9 is switched.

The band-pass filters 8 and 9 can arbitrarily switch the cutoff frequencies of the filters according to the clock frequencies of the filters as long as the band-pass filters 8 and 9 are filters like a CIC filter whose filter characteristic is determined by a clock frequency. A clock frequency generated in the clock generating section 16 is switched according to the frequency offset, so that it is possible to shift the center frequencies of the filters, prevent the FSK signal from being degraded by the attenuation of the filters, and prevent degradation of a receiving characteristic.

Further, the frequency offset frequency converted value S16 is fed back to the digital IQ demodulator 7 and quadrature demodulation is performed by a phase change of 0 and 90 degrees. In this case, a demodulator offset correcting unit multiplies, with the value S16, a frequency shift equivalent to the frequency offset and corrects the frequency offset amount on the demodulation baseband signal for the digital IQ demodulator. For example, this correction can be performed by using a sin table or the like and performing a multiplication of sin and cos according to the frequency.

Furthermore, the frequency offset frequency converted value S16 is fed back to the PLL 4 and a reference frequency generated in a prescaler in the PLL 4 is shifted according to the frequency offset by a PLL frequency correcting unit, so that a frequency obtained in consideration of the frequency offset is outputted as the reference frequency signal S4 from the PLL 4. The frequency to be frequency-converted by the MIXER 3 is obtained in consideration of the frequency offset, thereby correcting the frequency offset of the overall system. Thus, it is possible to prevent degradation of the FSK signal and the receiving characteristic.

In FIG. 3, regarding the frequency offset amount S100, for example, the maximum held value S12 serving as the maximum output may have an offset of 400 Hz due to noise, though an actual offset is 100 Hz. In this case, when 400 Hz is immediately fed back to the detected offset, a correction is made to a frequency displaced from the actual frequency by 300 Hz, resulting in an unstable system.

Hence, the feedback gain circuit 100 is provided with a given feedback gain value. For example, in feedback to the detected frequency offset amount S100 detected as one eighth, an offset amount of 50 Hz is fed back. Thus, it is possible to make a correction closer to the actual frequency and achieve stable operations in the system.

According to an actual system, a gain is increased for high noise, and a gain is reduced in a place where stable signal reception is expected. Thus, it is possible to more accurately correct a frequency offset in a place where stable signal reception is expected.

Embodiment 2

A semiconductor circuit device will be discussed below according to Embodiment 2 of the present invention.

Figure 4:
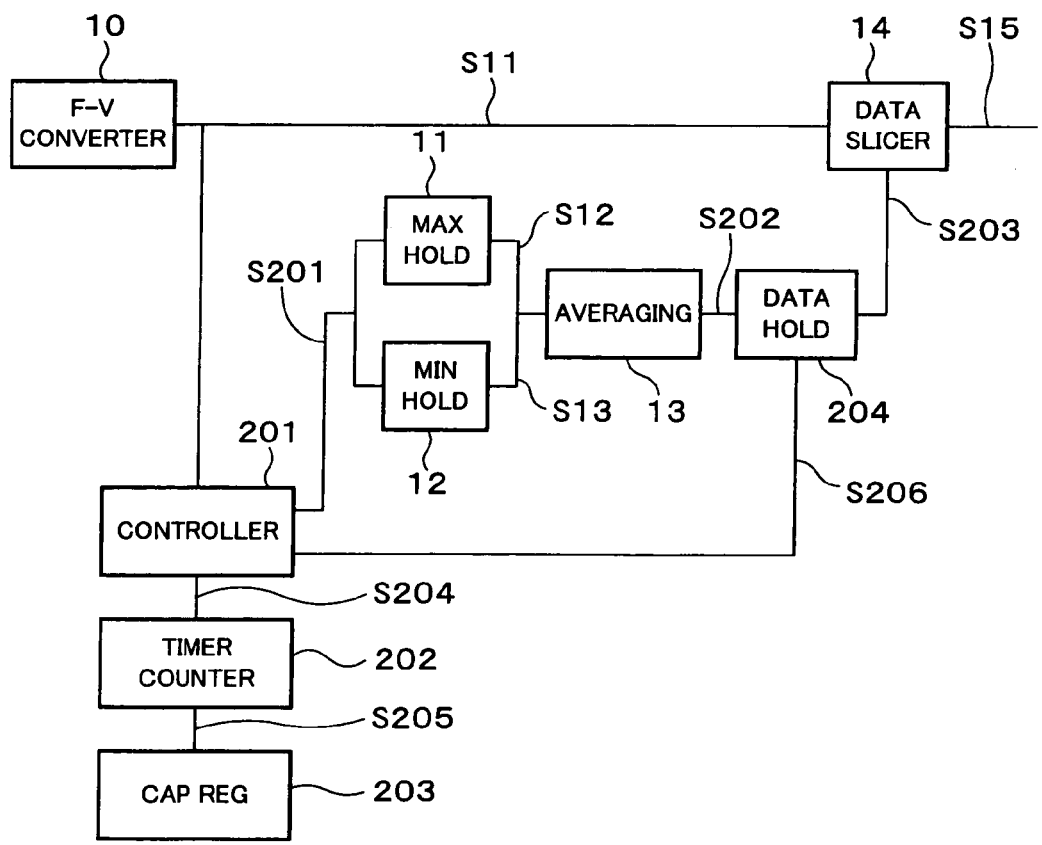
FIG. 4 is a block diagram showing the schematic configuration of an intermittent operation control section in a semiconductor circuit device according to Embodiment 2 of the present invention.

FIG. 4 is a block diagram showing a structural example of the semiconductor circuit device according to Embodiment 2. As shown in FIG. 4, the semiconductor circuit device has an operation controller circuit 201 for controlling the operation of a frequency offset detector by masking the output of a demodulation baseband signal S11, a timer counter 202 for generating the duty cycle of the operation controller circuit 201, a CAP register 203 serving as a counting period storage device capable of setting a given counting period for the timer counter 202, a timer count value register output S205 which is the output of the CAP register 203, a timer period signal S204 which is an operation enabling signal from the timer counter 202, a masked demodulation baseband signal S201 from the operation controller circuit 201, a frequency offset amount S202 which is the output of an averaging circuit 13, a holding circuit update enabling signal S206 which is a capturing timing signal from the operation controller circuit 201, a holding circuit 204 serving as a frequency offset value storage device for storing the frequency offset amount S202, which is an averaged output, according to the timing of the holding circuit update enabling signal S206, and a holding circuit held value S203 which is the output of the holding circuit 204.

First, the following will discuss the specific operations of the semiconductor circuit device shown in FIG. 4.

The timer counter 202 makes a count with a given period and outputs the timer period signal S204, which is an operation enabling signal, for each period. In response to the timer period signal S204 which is an operation enabling signal, the operation controller circuit 201 sends a masked demodulation baseband signal S11 to a maximum value holding circuit 11 and a minimum value holding circuit 12. With this operation, the frequency offset amount S202, which is an averaged output, is outputted and held by the holding circuit 204. The time when the frequency offset amount S202 is captured by the holding circuit 204 (update period) is held according to the timing of the holding circuit update enabling signal S206 which is the capturing timing signal outputted from the operation controller circuit 201. Hence, an intermittent operation can be performed with the period of the timer counter 202.

A given value is set for the CAP register 203 by means of software. The set value is loaded in the timer counter 202 at a given timing. The timer counter 202 operates according to the loaded period and similarly controls the masked demodulation baseband signal S201, which is an operation enabling control signal, and the holding circuit update enabling signal S206. This configuration can reduce the power consumption of the circuit. With the timer counter value set register 203, a given period can be set by software. When the stability of the system is confirmed by software, power consumption can be reduced in a programmable manner by increasing an intermittent operation period.

Embodiment 3

A semiconductor circuit device will be discussed below according to Embodiment 3 of the present invention.

Figure 5:
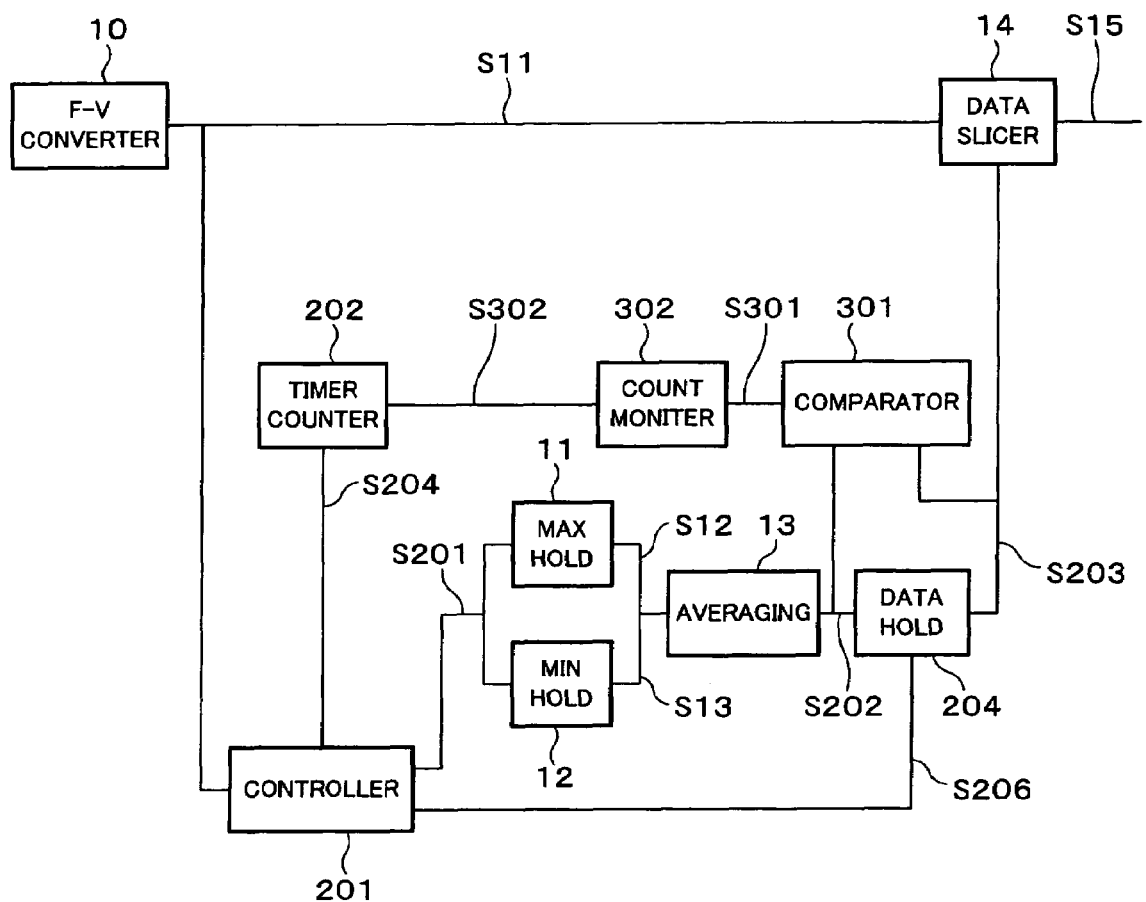
FIG. 5 is a block diagram showing the configuration of a count monitor circuit in a semiconductor circuit device according to Embodiment 3 of the present invention.
Figure 6:
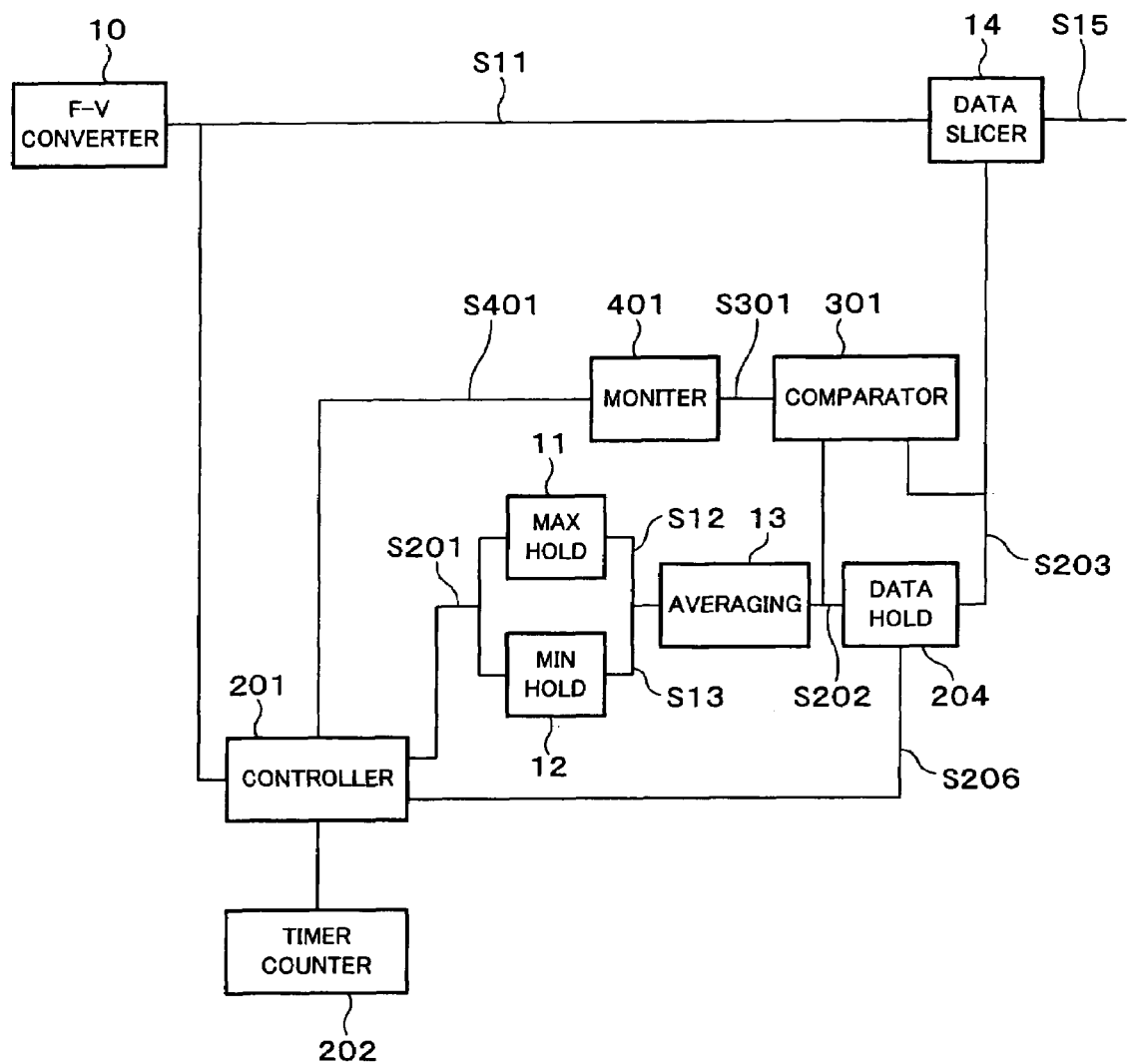
FIG. 6 is a block diagram showing the configuration of an average value holding circuit in the semiconductor circuit device according to Embodiment 3 of the present invention.

FIG. 5 is a block diagram showing a structural example of the semiconductor circuit device according to Embodiment 3. FIG. 6 is a block diagram showing another structural example of the semiconductor circuit device according to Embodiment 3.

As shown in FIG. 5, the semiconductor circuit device has a comparator 301 for comparing a frequency offset amount S202 serving as an averaged output and a holding circuit held value S203 of a holding circuit 204, a comparative value S301, a count monitor circuit 302 for deciding the movement amount of a frequency offset value according to the comparative value S301, and a movement amount decision result S302 which is a control signal from the count monitor circuit 302. Further, as shown in FIG. 6, the semiconductor circuit device has a monitor circuit 401 for deciding the moving direction and the movement amount of a frequency offset according to the comparative value S301, and a movement direction/amount decision result S401 serving as an output signal from the monitor circuit 401 and a holding circuit update enabling signal for the holding circuit 204.

The following will discuss the specific operations of the semiconductor circuit device shown in FIG. 5.

In FIG. 5, as described in Embodiment 2, by arbitrarily setting the period of a timer counter 202, a circuit operation is intermittently performed and thus power consumption is reduced. In this case, power consumption is reduced by automatically detecting a stable state of a system and automatically switching a timer counter period. To be specific, a comparison is made between the holding circuit held value S203 of the holding circuit 204 and the frequency offset amount S202 which is the output from the averaging circuit 13 before being held, that is, current data and data one period before are compared with each other on a time base by the comparator 301. The comparator outputs the comparative value S301.

In this case, a difference is obtained. It is not particularly necessary to obtain a difference. Based on the comparative value S301, the counter monitor circuit 302 controls the value of the timer counter 202 according to a movement amount. For example, when a movement amount decreases, the period of the timer counter 202 is increased to reduce power consumption. When a movement amount increases, a person on the other end may be changed or other factors may affect the movement amount, and thus the operating period of the timer counter 202 is shortened and the holding circuit is updated more frequently. Hence, the power consumption of the circuit can be automatically reduced.

The following will discuss the specific operations of the semiconductor circuit device shown in FIG. 6.

In FIG. 6, a unit for deciding a moving direction is added to the configuration of FIG. 5. That is, in the monitor circuit 401, the moving direction of a frequency offset, to be specific, the code of the most significant bit is decided for the comparative value S301 from the comparator 301. When the code is reversed and a movement amount is large, the moving direction/amount decision result S401 serving as a held value update enabling signal is not issued and the current held value is held by an operation controller circuit 201. With this operation, it is possible to prevent oscillation of a corrected value, thereby achieving a more stable system.

Embodiment 4

A semiconductor circuit device will be discussed below according to Embodiment 4 of the present invention.

Figure 7:
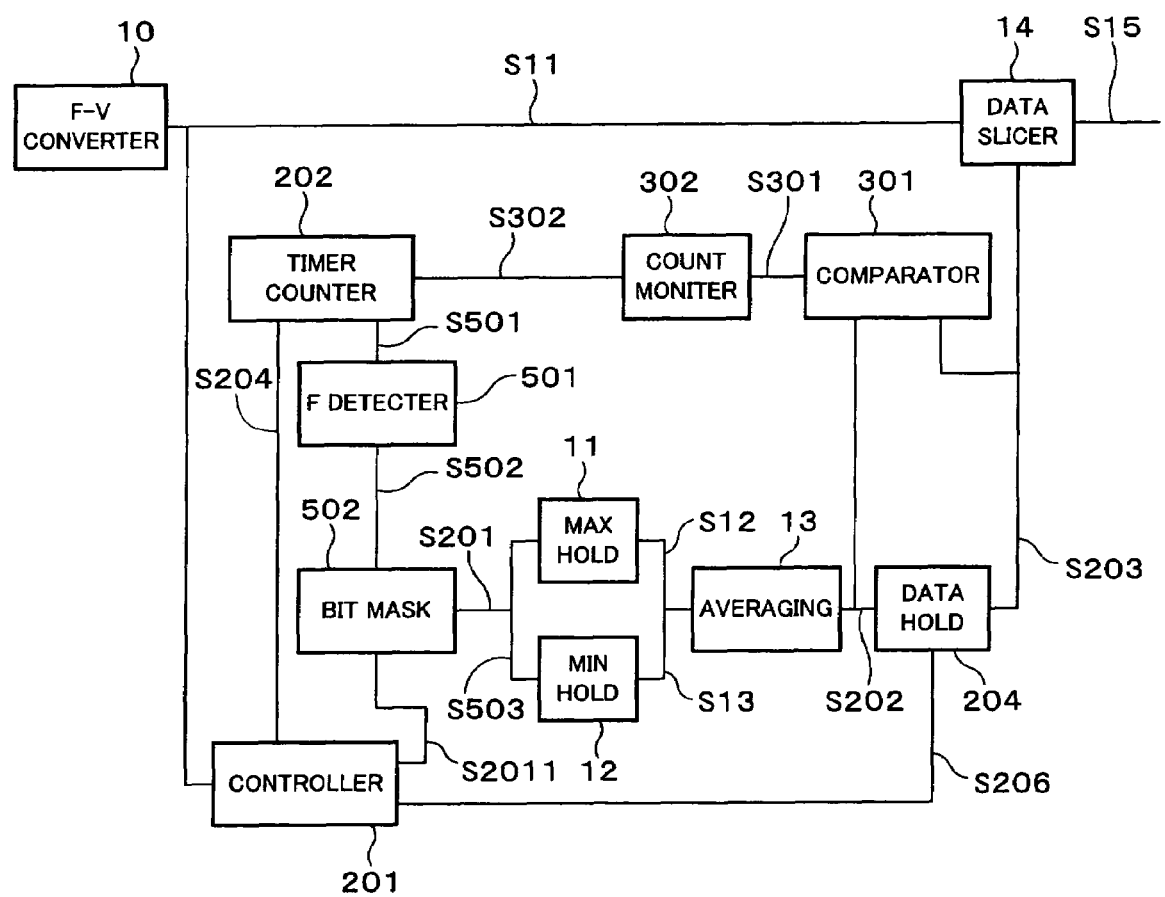
FIG. 7 is a block diagram showing the schematic configuration of a power consumption reduction circuit in a semiconductor circuit device according to Embodiment 4 of the present invention.

FIG. 7 is a block diagram showing a structural example of the semiconductor circuit device according to Embodiment 4. As shown in FIG. 7, the semiconductor circuit device has a timer counter period signal S501 which is a period signal from a timer counter 202, an F detector circuit 501 for deciding the period of the timer counter 202 based on the timer counter period signal S501, a period decision result S502 which is a control signal from the F detector circuit 501, a bit mask circuit 502 for bit masking on a demodulation baseband signal S2011 from an operation controller circuit 201 in response to the period decision result S502, and bit mask data S503 which is the output of the bit mask circuit.

The following will discuss the specific operations of the semiconductor circuit device shown in FIG. 7.

In FIG. 7, the period of the timer counter 202 is automatically switched according to the timer counter period control signal of a movement amount decision result S302 outputted by a count monitor circuit 302. The F detector circuit 501 decides a counting period based on the timer counter period signal S501 from the timer counter 202. When the F detector circuit 501 decides that the period is larger than a predetermined criterion of decision, it is decided that a stable operation is performed and the F detector circuit 501 sends the period decision result S502 as a control signal. The period decision result S502 is a control signal indicating that the period is stabilized and increased. When a stable state of a system is detected based on the period decision result S502, the bit mask circuit 502 masks lower-order bits and monitors only higher-order bits.

With these operations, the power consumption of the circuit is reduced. Additionally, the maximum value and the minimum value are changed only when several higher-order bits move, that is, only when a large change is found. The bit mask data S503 masked by the bit mask circuit 502 is a signal of only several bits and thus has no lower-order bits. When only a small change is found, the bits do not change and thus power consumption is reduced during a circuit operation. Further, an averaged output is not changed, so that a frequency offset amount hardly changes. This circuit makes it possible to reduce an operating current for a stable operation.

What is claimed is:

1. A semiconductor circuit for detecting and correcting a frequency offset in data communication for demodulating digital data from a high-frequency signal having a carrier frequency modulated based on the digital data, comprising:
   a digital IQ demodulator for performing quadrature demodulation on a digital signal obtained by digital conversion from an analog signal having been obtained by frequency-converting the high-frequency signal while using an oscillation output of a PLL as a reference frequency signal,
   an F-V converter circuit for converting a frequency of a digital output signal from the digital IQ demodulator to a voltage and outputting a demodulation baseband signal corresponding to the digital data after passing the digital output signal through a band-pass filter, a maximum value holding circuit for holding a maximum value of the demodulation baseband signal outputted from the F-V converter circuit, a minimum value holding circuit for holding a minimum value of the demodulation baseband signal, an averaging circuit for averaging the maximum value of the demodulation baseband signal and the minimum value of the baseband signal, a frequency offset detector for detecting a frequency offset amount on the demodulation baseband signal from the averaging circuit, and an offset correcting unit for correcting the frequency offset amount on the demodulation baseband signal by varying a threshold value for deciding data of the demodulation baseband signal outputted from the F-V converter circuit based on the frequency offset amount having been detected by the frequency offset detector.

2. A semiconductor circuit for detecting and correcting a frequency offset in data communication for demodulating digital data from a high-frequency signal having a carrier frequency modulated based on the digital data, comprising:

a digital IQ demodulator for performing quadrature demodulation on a digital signal obtained by digital conversion from an analog signal having been obtained by frequency-converting the high-frequency signal while using an oscillation output of a PLL as a reference frequency signal, an F-V converter circuit for converting a frequency of a digital output signal from the digital IQ demodulator to a voltage and outputting a demodulation baseband signal corresponding to the digital data after passing the digital output signal through a band-pass filter, a maximum value holding circuit for holding a maximum value of the demodulation baseband signal outputted from the F-V converter circuit, a minimum value holding circuit for holding a minimum value of the demodulation baseband signal, an averaging circuit for averaging the maximum value of the demodulation baseband signal and the minimum value of the baseband signal, a frequency offset detector for detecting a frequency offset amount on the demodulation baseband signal from the averaging circuit, a frequency converter circuit for frequency-converting the frequency offset amount having been detected by the frequency offset detector, a filter bandwidth correcting unit for correcting a bandwidth of the band-pass filter based on a frequency converted value corresponding to the frequency offset amount having been calculated by the frequency converter circuit, and an offset correcting unit for correcting the frequency offset amount on the demodulation baseband signal by varying a threshold value for deciding data of the demodulation baseband signal outputted from the F-V converter circuit based on the frequency offset amount having been detected by the frequency offset detector.

3. The semiconductor circuit for detecting and correcting a frequency offset in data communication according to claim 2, further comprising a PLL frequency correcting unit for controlling a frequency of an oscillation output of the PLL and correcting the frequency offset amount on the demodulation baseband signal based on a frequency converted value from the F-V converter circuit corresponding to the frequency offset amount.

4. The semiconductor circuit for detecting and correcting a frequency offset in data communication according to claim 1, further comprising a feedback gain circuit which provides a given gain for the frequency offset amount having been detected by the frequency offset detector, and uses the frequency offset amount as a feedback signal to the threshold value for deciding the data of the demodulation baseband signal.

5. The semiconductor circuit for detecting and correcting a frequency offset in data communication according to claim 1, further comprising an operation controller circuit for periodically operating the frequency offset detector, and a timer counter for counting a duty cycle of the frequency offset detector operated by the operation controller circuit.

6. The semiconductor circuit for detecting and correcting a frequency offset in data communication according to claim 5, further comprising a counting period storage device for storing a set value for setting a counting period of the timer counter at a given value.

7. The semiconductor circuit for detecting and correcting a frequency offset in data communication according to claim 6, further comprising a frequency offset value storage device for storing the frequency offset value having been detected by the frequency offset detector, and an operation controller circuit for exercising control to update a value of the frequency offset value storage device with a given period.

8. The semiconductor circuit for detecting and correcting a frequency offset in data communication according to claim 7, further comprising a comparator for comparing the frequency offset value having been stored in the frequency offset value storage device and the frequency offset value currently detected by the frequency offset detector, and a unit for deciding a change in the frequency offset value based on a comparison result of the comparator, causing the counting period storage device to store a count set value of the timer counter according to a decision result, and changing the duty cycle of the frequency offset detector operated by the operation controller circuit.

9. The semiconductor circuit for detecting and correcting a frequency offset in data communication according to claim 8, further comprising an operation controller circuit for generating a control signal for controlling update of the frequency offset value, the control signal being generated according to a moving direction and a movement amount decided based on a code of the frequency offset value in the comparison result of the comparator.

10. The semiconductor circuit for detecting and correcting a frequency offset in data communication according to claim 5, further comprising an F detector circuit for deciding a period of the timer counter, and a bit mask circuit for masking specific bits of the demodulation baseband signal according to the period decided by the F detector circuit.

11. A semiconductor circuit for detecting and correcting a frequency offset in data communication for demodulating digital data from a high-frequency signal having a carrier frequency modulated based on the digital data, comprising:

a digital IQ demodulator for performing Quadrature demodulation on a digital signal obtained by digital conversion from an analog signal having been obtained by frequency-converting the high-frequency signal while using an oscillation output of a PLL as a reference frequency signal, an F-V converter circuit for converting a frequency of a digital output signal from the digital IQ demodulator to a voltage and outputting a demodulation baseband signal corresponding to the digital data after passing the digital output signal through a band-pass filter, a maximum value holding circuit for holding a maximum value of the demodulation baseband signal outputted from the F-V converter circuit, a minimum value holding circuit for holding a minimum value of the demodulation baseband signal, an averaging circuit for averaging the maximum value of the demodulation baseband signal and the minimum value of the baseband signal, a frequency offset detector for detecting a frequency offset amount on the demodulation baseband signal from the averaging circuit, an offset correcting unit for correcting the frequency offset amount on the demodulation baseband signal by varying a threshold value for deciding data of the demodulation baseband signal outputted from the F-V converter circuit based on the frequency offset amount having been detected by the frequency offset detector, and a demodulator offset correcting unit for correcting the frequency offset amount on the demodulation baseband signal for the digital IQ demodulator based on a frequency converted value from the F-V converter circuit corresponding to the frequency offset amount.

* * * * *